United States Patent [19]
Koch

[11] Patent Number: 4,745,607
[45] Date of Patent: May 17, 1988

[54] INTERLAYER DIRECTIONAL COUPLING IN ANTIRESONANT REFLECTING OPTICAL WAVEGUIDES

[75] Inventor: Thomas L. Koch, Middletown, N.J.

[73] Assignee: American Telephone and Telegraph Company, AT&T Bell Laboratories, Murray Hill, N.J.

[21] Appl. No.: 916,498

[22] Filed: Oct. 8, 1986

[51] Int. Cl.⁴ .............................................. H01S 3/19
[52] U.S. Cl. ....................................... 372/45; 357/30; 372/50; 372/96; 372/97
[58] Field of Search ...................... 372/92, 97, 50, 98, 372/96, 99, 102, 95, 108, 45, 46; 357/30 D, 30 C, 30 F, 30 H, 30 L, 30 R; 358/212, 225, 266; 370/1, 3, 69.1, 120; 350/162.23

[56] References Cited

U.S. PATENT DOCUMENTS 3,978,426 6/1976 Logan et al. .......................... 372/45
4,575,851 3/1986 Seki et al. .............................. 372/45

OTHER PUBLICATIONS

"Antiresonant Reflecting Optical Waveguides in Si-O₂—Si Multilayer Structures", App. Phys. Lett. 49, 7/7/86, M. A. Duguay et al., pp. 13–15.

*Primary Examiner*—James W. Davie
*Assistant Examiner*—Georgia Y. Epps
*Attorney, Agent, or Firm*—Daniel D. Dubosky; Gregory C. Ranieri

[57] ABSTRACT

A grating in the upper reflecting layer (103 or 203) of an antiresonant reflecting optical waveguide is used to extract energy of a selected wavelength from the waveguiding layer (102 or 202) into the reflecting layer. In one embodiment the reflecting layer (103) is designed as a gain medium which is pumped in the region of a grating (120) and optically terminated at each end of the device such that the embodiment serves as a laser having a long cavity provided by the waveguiding layer (102) with the gain provided in the short grating region. In a second embodiment the reflecting layer (203) in the region of a grating (211) has an opposite conductivity dopant from that of the waveguiding layer (202) such that the device in this region may be backbiased to serve as a wavelength selective photodetector. By placing two wavelength photodetectors in tandem with gratings (211 and 212) of different pitches a wavelength demultiplexing photodetector is provided.

9 Claims, 3 Drawing Sheets

CO-DIRECTIONAL

CONTRA-DIRECTIONAL

INTERLAYER DIRECTIONAL COUPLING IN ANTIRESONANT REFLECTING OPTICAL WAVEGUIDES

This invention relates to optical waveguides and more particularly to optical waveguides which use antiresonant reflection to achieve confinement in a waveguiding layer.

BACKGROUND OF THE INVENTION

Considerable work has been done in the prior art in an effort to couple semiconductor lasers into monolithically integrated passive waveguide regions. This is desirable in the fabrication of distributed Bragg reflector lasers and long cavity lasers of the type used to achieve narrow linewidth. In addition the whole idea of integrated optics wherein active components such as lasers are integrated with modulators, amplifiers and detectors relies on achieving some mechanism for guiding the light from one device to the next without excessive losses.

One waveguide of the prior art which has been developed that can be easily fabricated on integrated semiconductor devices is known as the antiresonant reflecting optical waveguide (ARROW). See the article entitled "Anti-Resonant Reflecting Optical Waveguides in SiO-Si Multi-Layer Structures", by M. A. Duguay et al., *Applied Physics Letters*, Vol. 49, No. 1, pp. 13–15, 1986. This type of waveguide achieves confinement in a waveguiding layer by the fact that the layers below this guiding layer form a series of FabryPerot resonators all in antiresonance. This type of waveguide has been fabricated both in dielectrics deposited on silicon substrates and in III–V semiconductor materials.

One method of coupling passive waveguides such as the ARROW structure to lasers and other types of active optical devices is to etch the layers of the optical device and re-grow those layers which are necessary in order to provide the waveguide, or vice-versa. The same layers cannot be used for both active devices and waveguiding since active devices usually require a layer with gain or absorption and this same active layer when unpumped produces high losses at the wavelength of interest. Since the passive and active sections of the integrated device have different layer structures they must be buttcoupled in order to form an entire circuit or system. This form of coupling is difficult since it requires a careful vertical registration of the re-grown layers. This is especially true since efficient coupling requires the passive guide to have the same mode size as the mode in the active device and active devices often have optimum performance with thin layers and small modes. This also makes coupling the passive guide to external elements rather difficult.

SUMMARY OF THE INVENTION

Active optical devices can be totally integrated on a substrate which supports an antiresonant reflecting optical waveguide by designing the reflector layers of the ARROW structure to serve as the guide layers of the active optical devices. In accordance with the present invention, energy is directionally coupled from the waveguiding layer of the ARROW structure into the immediately adjacent reflector layer in those predetermined sections along the guide of the integrated structure where it is desired to place an active device. The coupling between the guiding layer of the ARROW structure and the active guiding layer is achieved through the use of a grating which is fabricated with the proper pitch is as to provide coupling at a selected wavelength between the ARROW mode and the reflector layer mode of the active device.

In accordance with a first embodiment of the invention the grating is developed in the reflector layer of an ARROW structure by two intersecting beams of coherent light which also serve as a pump to achieve lasing action. Wavelength selectively is provided by the fact that the optical cavity needed for lasing action uses the grating to couple the light into a significantly longer guiding layer immediately adjacent to the active layer being pumped.

In accordance with a second embodiment of the present invention, a wavelength demultiplexing photodetector is provided in an ARROW structure by fabricating gratings having different pitches in the upper reflector layers of the structure at predetermined locations along the length of an antiresonant reflecting optical waveguide. The different pitches of the gratings select different wavelengths to be coupled out of the guiding layer into the absorptive reflector layer immediately beneath the guiding layer. A proper placement of electrical terminals immediately over the grating structures permits the development of electrical signals due to the photocurrent resulting from the absorption of the individual wavelengths.

DETAILED DESCRIPTION

Figure 3:
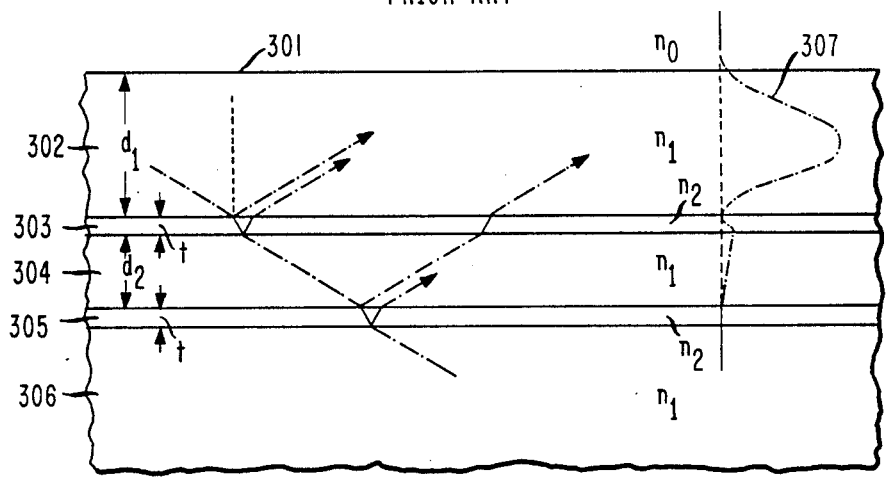
FIG. 3 is a diagram useful in explaining the operation of antiresonant reflecting optical waveguides of the prior art.

Diagrams useful in explaining the operation of Anti-Resonant Reflecting Optical Waveguides (ARROWs) present in the prior art are shown in FIG. 3. These guides, first demonstrated in a $SiO_2/Si$ multi-layer structure, have recently been fabricated in III–V compound semiconductors with lateral confinement and losses below 1 cm$^{-1}$, and have demonstrated a potential for substantially lower loss. In the ARROW geometry, the ARROW mode (which will usually be the "passive" mode 2 in what follows) is confined at the upper surface 301 of layer 302 by conventional total internal reflection, but on the other substrate side by phased reflections from the interfaces of two higher index reflector layers 303 and 305. These layers 303 and 305 and the intervening layer 304 form a series of Fabry-Perot resonators all in anti-resonance. Accordingly, the reflection provided is spectrally broad and tolerant of variations introduced by fabrication.

The approximate optimum thicknesses of the reflector layers 303, 304 and 305 for a given core thickness $d_1$ of layer 302 are as follows:

$$t_{opt} \approx \frac{\lambda}{4n_2}(2N+1)\left[1 - \frac{n_1^2}{n_2^2} + \frac{\lambda^2}{4n_2^2 d_1^2}\right]^{-\frac{1}{2}} \quad N = 0,1,2\ldots \quad (1)$$

and $$d_{2opt} \approx \frac{d_1}{2}(2M+1) \quad M = 0,1,2,\ldots \quad (2)$$

where $t_{opt}$ is the optimum thickness of layers 303 and 305, $d_{2opt}$ is the optimum thickness of layer 304, $n_1$ is the index of refraction of layers 302 and 304 and substrate 306, $n_2$ is the index of refraction of layers 303 and 305, and $\lambda$ is the wavelength of light being guided.

The ARROW mode, whose amplitude is illustrated by curve 307 in FIG. 3, is actually a leaky mode, and its energy is confined in layer 302, in the region with the lowest index of refraction (apart from the upper air interface). This leads to an extraordinarily low effective index. A good approximation to the fundamental ARROW mode effective index in a properly designed structure as outlined above is given by $$n_{eff} \approx n_1 \left[1 - \frac{\lambda^2}{4n_1^2 d_1^2}\right]^{\frac{1}{2}} \quad (3)$$

Figure 4:
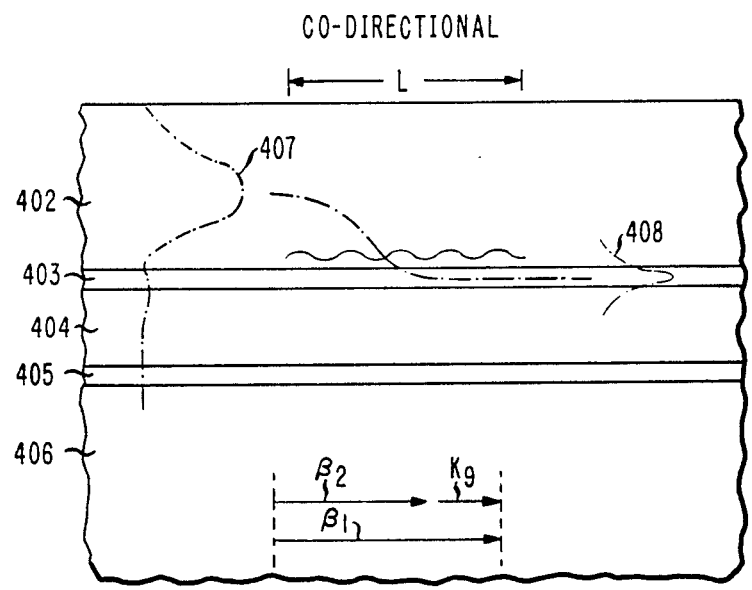
FIGS. 4 and 5 are diagrams useful in explaining the operation of the present invention.
Figure 5:
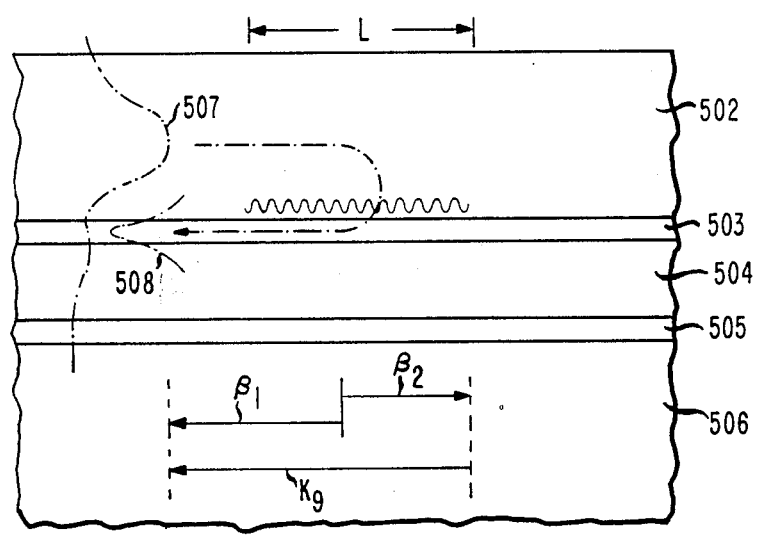

The present invention is based on the fact that in the ARROW geometry the high index reflector layer 403 of FIG. 4 can support a conventional guided mode with a correspondingly high effective index as indicated by curve 408 in FIG. 4. A very large difference in effective indices exists between the passive ARROW mode, confined almost totally in the lowest index layer 402, and the conventionally guided mode, confined mostly in the highest index layer 403. Despite this, these two modes are also confined in immediately adjacent layers and are thus amenable to grating coupling of the type provided in accordance with the present invention. Another important feature is that the passive ARROW mode typically has exceedingly small confinement ($<10^{-3}$) in the active reflector layer 403 and can thus propagate in the guiding layer 402 in the absence of a grating, with negligible loss even when large losses are present in the active reflector layer 403. The passive ARROW mode in layer 402 can then be specialized for low loss and large mode size for coupling to external elements, while the active mode in layer 403 can be optimized for overlap with the active reflector layer. In accordance with the present invention, coupling is achieved at predetermined locations along the length of the guiding layer with a grating in an all planar technology uniform structure. The two cases of co-directional and contra-directional coupling are shown in FIGS. 4 and 5 respectively. The utility of a grating lies in its ability to provide coupling between two transverse modes of a system which have very different phase velocities or propagation constants. Another desirable property which is exploited in the present invention is that the two modes in question may have very different spatial properties.

For a quantitative discussion, consider a transverse mode 1 with propagation constant $\beta_1$ and a transverse mode 2 with propagation constant $\beta_2$. Assume that mode 1 and mode 2 mutually overlap in a spatial region which contains a periodic perturbation of the real or imaginary index of refraction with a period $\Lambda_g$. It is a standard result of coupled mode theory that coupling between the modes is obtained provided the following "phase matching" condition is satisfied:

$$\beta_1 = \beta_2 + K_g \quad (4)$$

where for simplicity $|\beta_1| > |\beta_2|$ is assumed. Here $K_g = 2\pi/\Lambda_g$ is the fundamental wavevector of the grating, but since coupling can result from the higher Fourier components of a periodic perturbation, $K_g$ is considered to correspond to the relevant Fourier component of interest. Following standard nomenclature, cases where $\beta_1/|\beta_1| = \beta_2/|\beta_2|$ are referred to as "co-directional" coupling, and cases where $\beta_1/|\beta_1| = -\beta_2/|\beta_2|$ are referred to as "contra-directional" coupling. In the discussion hereinafter mode 1 is the "active" mode in the upper reflector layer and mode 2 is the "passive" mode in the waveguiding layer.

The mode conversion will also be wavelength selective due to the grating. In particular, coupling occurs in spectral regions where Eq. (4) is satisfied, which requires $$\Lambda_g = \lambda/(n_{eff1} \pm n_{eff2}) \quad (5)$$

where the $-$ sign is for co-directional coupling and the $+$ sign is for contradirectional coupling. The value for $\Lambda_g$ may be modified by the fact that coupling can result from higher Fourier components of the grating. For example, if second order components are considered, $\Lambda_g$ would be replaced by $\Lambda_g/2$. The spectral width and degree of coupling depend in detail on (1) the grating interaction length, (2) the coupling strength of the grating, (3) whether the coupling is co- or contra-directional, and (4) whether either mode sees appreciable gain or loss. From Eq. (5) it is evident that one would like to achieve a situation where $n_{eff1}$ and $n_{eff2}$ are substantially different. In the co-directional case, this is desirable since one often wants a high spectral selectivity (and hence a large number of grating lines) in a reasonable interaction length. For contra-directional coupling, one usually does not want reflective coupling of mode 1 or mode 2 onto themselves, which occurs respectively at $\lambda = \Lambda_g/(2.n_{eff1})$ and $\lambda = \Lambda_g/(2.n_{eff2})$, to be within the spectral band of interest. More generally, in the present invention one wants total lack of coupling in the absence of the grating. This usually demands as sizable a mismatch between the two modes as possible.

In the embodiments to be discussed hereinafter only the mode energy present in the upper reflector layer is considered; the lower reflector layer is essentially ignored from the standpoint of cross-coupling. In most ARROW structures, this is possible since the two reflector layers are far apart. In any embodiment where cross-coupling between the reflector layers becomes a problem, it can be circumvented by making the lower reflector layer from a slightly different material composition and hence giving it a slightly different index of refraction.

The principal requirement on the vertical placement of the grating is that both the active and passive modes must mutually overlap within the grating. In FIGS. 4 and 5, the grating is just shown conceptually. As shown in FIGS. 4 and 5 by curves 407 and 507 respectively, each one of which represents the relative magnitude of light intensity in a direction perpendicular to the direction of propagation, the ARROW mode has a node at the upper surface of the high index reflector layer 403 or 503, and an anti-node at the lower surface. The reflector layer conventional mode indicated by curves 408 and 508 has evanescently decaying wings into both the waveguiding layer (402 or 502) and the space between the reflector layers. The grating could thus be any form of volume grating, or a suitable set of corrugated layers, in the lower portion of the ARROW waveguiding layer. Another option which is easily implemented is a corrugation along the lower surface of the upper reflector layer. The active mode has a high amplitude here, and the ARROW mode, while smaller here, does have an anti-node for appreciable amplitude. Another possibility is a volume grating in the reflector layer itself. The best choice depends on the detailed requirements of the device under consideration. In general, the elements shown as gratings in FIGS. 4 and 5 are simply periodic variations in the index of refraction along the direction of propagation at a level of the device where the ARROW mode and the reflector layer mode each have something other than zero light intensity.

Figure 1:
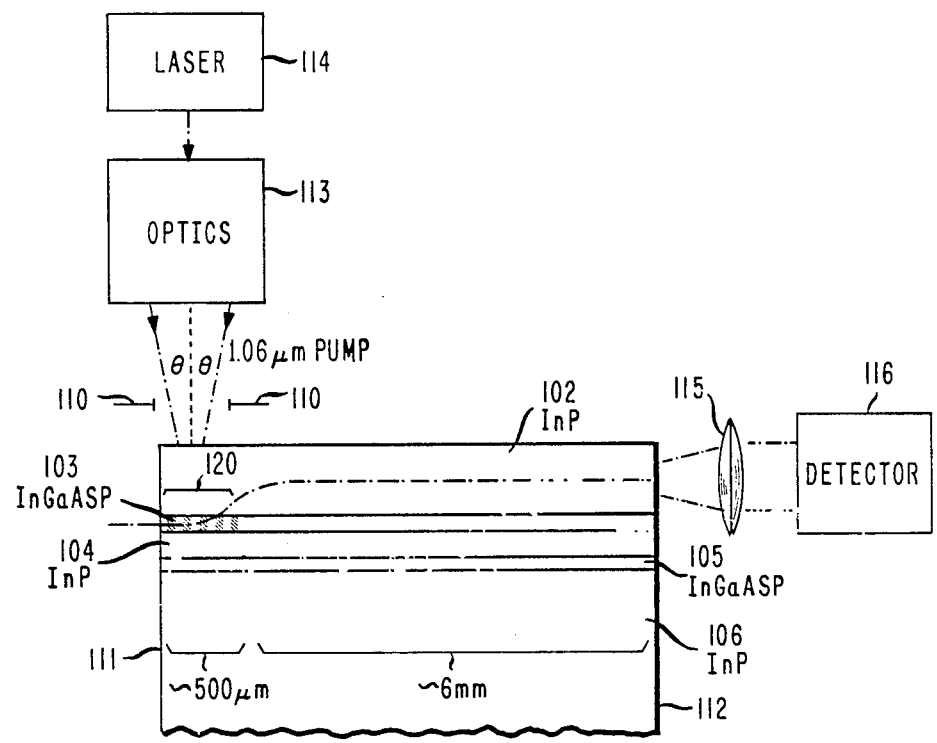
FIG. 1 is a laser constructed in accordance with the present invention.

An embodiment of the present invention wherein an optically induced grating is used to provide co-directional coupling between the guiding layer and reflecting layer of an ARROW structure is shown in FIG. 1. The ARROW structure is grown on an InP substrate 106 by using hydride vapor phase epitaxy to grow a lower reflector layer 105 of InGaAsP, a separation layer 104 of InP, an upper reflector layer 103 of InGaAsP, and an ARROW waveguiding layer 102 of InP. Both reflector layers 103 and 105 are fabricated from an InGaAsP quaternary material having a luminescent peak at 1.35 $\mu$m.

The reactor used in the hydride vapor phase epitaxy system in a three barrel system designed for rapid switching to allow complex multi-layer structures with good interface quality. Flows of the growth constituents in a hydrogen carrier are first equilibrated and growth is initiated or terminated by mechanically inserting or withdrawing the sample from the proper barrel. Hydrogen chloride is passed over indium and gallium metals which are maintained at 850 degrees C. The sample is heated to about 725 degrees C. for epitaxial growth, and the group V elements are provided by arsine and phosphine.

The grown structure was optically pumped at 667 Hz repetition rate with pulses of about 100 psec duration and 1.06 $\mu$m wavelength. These pulses were electro-optically selected from the output pulse train of a Q-switched, mode-locked Nd:YAG laser 114. The InP waveguiding layer 102 is transparent to the 1.06 $\mu$m light, but the pulses are absorbed in the 1.35 $\mu$m reflector layers 103 and 105.

In addition to optically pumping the gain medium for lasing, the 1.06 $\mu$m pump pulses are used to provide a grating 120 for vertical directional coupling. This is accomplished by pumping with two interfering 1.06 $\mu$m beams which are incident on the wafer surface at angles of $+\theta$ and $-\theta$ with respect to the surface normal. This produces an interference pattern with a period given by $$\Lambda_g = \lambda_{pump}/(2 \sin \theta) \tag{6}$$

Snell's law guarantees that this period is preserved in the energy deposited into the active reflector layers. This is capable of producing the coarse grating required to achieve co-directional coupling when the angle $\theta$ produces the period required by Eq. (5). The grating so produced by the photogenerated carriers has a combination of both real and imaginary components. The linewidth enhancement factor $\alpha$ of long wavelength semiconductor lasers, which provides the proportionality between the differential change in real and imaginary indices with respect to carrier density, has a value of about $-6$. While this is only a measure for small changes in carrier density under bias conditions typical to semiconductor lasers, it provides a useful estimate for the relative values of real and imaginary components. The grating thus formed is predominantly real. The angle $\theta$ from the surface normal for each beam was in the 2 to 3 degree range, so about 70 percent of the incident 1.06 $\mu$m pump is transmitted into the wafer.

A scanning electron micrograph of the layer structure revealed that the quaternary reflector layers 103 and 105 were about 0.33 $\mu$m thick while the InP waveguiding layer 102 is 6.9 $\mu$m thick with a 3.3 $\mu$m thick InP layer 104 between the reflector layers. By extrapolating from InGaAs absorption data, it can be estimated that approximately 35 percent of the light which reaches the reflecting layers will be absorbed at 1.06 $\mu$m for these thicknesses. This leads to a net deposition of 25 percent of the 1.06 $\mu$m pump incident on the sample surface into the upper reflector layer 103 and 16 percent into the lower reflector layer 105.

In the experiment conducted the pump pulses were coupled through an adjustable aperture 110 to limit the grating and gain region to only a small portion (about 500 $\mu$m) of the 6 mm long sample adjacent to an end facet 111 as shown in FIG. 1. Since the majority of the wafer is unpumped and the active or gain mode is strongly absorbing at any wavelength where there would be sufficient gain for lasing, lasing can only occur when light is coupled into the passive ARROW mode for low loss propagation across the wafer to the other end facet 112 to complete the cavity. This coupling can only occur when the interference angle between the two pump beams is $$\theta = \sin^{-1}\left[\frac{\lambda_{pump}(n_{eff1} - n_{eff2})}{2\lambda_{lase}}\right] \tag{7}$$

as described earlier. In addition, with co-directional coupling, the grating strength and the grating interaction length play a significant role in the device performance.

The pump beams were focused onto the ARROW structure with a combination of spherical and cylindrical optics 113 to provide a thin pencil of illumination roughly 100 $\mu$m wide and of arbitrary length. This pumping width is the only lateral confinement in the experiment, and is chosen to be wide enough such that any round trip lateral diffraction losses in the several millimeter long ARROW mode propagation across the unpumped region to the end mirror and back will not pose a severe problem.

Quantities varied in the experiment were the incident angles $\pm\theta$ of the pump beams, the pump intensity (which can affect both the gain level and the grating strength), and interaction length L. The output from the sample was measured through the end facet 112 at the unpumped end by imaging the rear facet through a lens 115 onto a detector 116. In detector 116 a 1 cm thickness of silicon was used to filter out any residual 1.06 $\mu$m pump light. Quantities monitored included the output power, the output near field, and crude measures of the output spectrum. Lasing in accordance with the present invention was confirmed.

Figure 2:
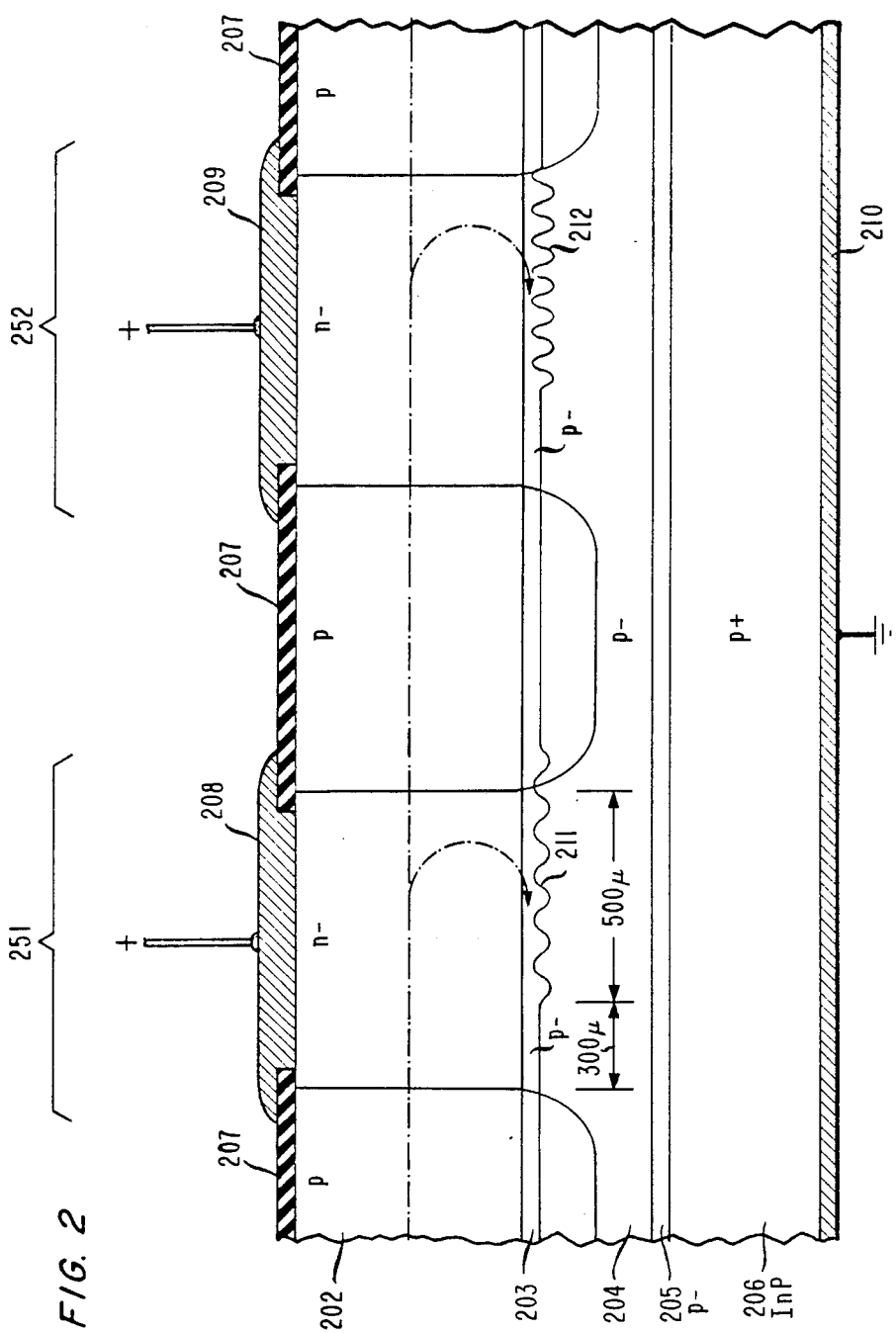
FIG. 2 is a wavelength demultiplexing photodetector constructed in accordance with the present invention.

Another example of the application of grating-coupled modes in the ARROW geometry is shown in FIG. 2. In FIG. 2 an ARROW guide is fabricated in the InP/InGaAsP materials system with two different pitch gratings along the length of the upper reflector layer to provide a wavelength demultiplexing photodetector device. The structure shown could appear in any portion of a larger wafer, or as a single discrete device in itself. In this structure light of the selected wavelengths is directionally coupled with a grating in the manner described earlier, either co-directionally or contra-directionally, into the reflector layer where it is absorbed. With the doping as shown, the reflector layer is depleted through reverse biasing of a p-n junction. As a result, each section of the device operates as a wavelength-selective photodetector with the free carriers generated by absorption being swept across the depletion region to provide a photocurrent.

The principal advantage of the device shown in FIG. 2 is the integratable nature of this demultiplexer. As mentioned earlier, this is a true planar technology approach and the wavelength-selective photodetecting regions may have a layer structure identical to that of the purely passive waveguiding regions apart from the grating which couples the modes. This makes it possible to place several detectors of this sort in a serial fashion along a waveguide with different pitch gratings for coupling into the absorbing upper reflector layer. Since the different pitch gratings result in a different wavelength satisfying the phasematching requirement, each wavelength will pass over the detectors until reaching the one with the pitch appropriate for its coupling into the reflector layer and hence detection. The invention is thus suitable for making a compact, monolithic wavelength division demultiplexing photodetector.

In FIG. 2, a demultiplexing photodetector device is shown with a first wavelength selective detector in region 251 and a second wavelength-selective detector in region 252. The wavelength detector in region 251 is designed for operation around 1.540 $\mu$m whereas the detector in region 252 is designed for operation at 1.545 $\mu$m. The waveguiding layer 202 throughout is fabricated from InP which has an index of 3.1654 at these wavelengths, and the reflector layers 203 and 205 are fabricated of InGaAsP lattice matched to InP with a composition such as to give a luminescence peak at 1.51 $\mu$m. Accordingly, the reflector layers 203 and 205 have an absorption at the operating wavelengths in the range of about 100 cm$^{-1}$. The index of refraction of reflector layer 203 is 3.5450 at the operating wavelengths. As shown in FIG. 2, a grating has been etched in each of the two regions on the upper surface of the InP separation layer 204 prior to the growth of the quarternary upper reflector layer 205. The dimension for the waveguiding layer 202 is 5 $\mu$m, since this permits a large mode suitable for good coupling to external elements and also reduces ARROW radiation loss to a negligible level. The lower reflector layer 205 is chosen to have a thickness of 0.25 $\mu$m, and the InP separation layer 204 between the two reflector layers is 2.5 $\mu$m thick. Each grating has a peak to peak depth of 1000 A, and the remaining undisturbed thickness of the quarternary upper reflector layer 205 is 0.3 $\mu$m. These dimensions are chosen as a good compromise between exceptionally low loss propagation of the ARROW mode and a good coupling constant through the etched grating into the conventionally guided reflector layer. Contra-directional coupling is chosen in the device shown in FIG. 2 since this gives a high degree of spectral selectivity in a short distance due to the high pitch grating. In addition, it has no additional losses due to coupling into other radiation modes which may happen in some co-directional geometries.

The modal properties and grating coupling have been numerically evaluated for this geometry and yield the following values at the detected wavelength. The effective index of the ARROW mode is 3.161954, while the effective index of the conventional mode in the upper reflector layer, including the presence of the grating, is 3.35943. The coupling constant for the contra-directional coupling between these two modes is 32 cm$^{-1}$. The grating pitch for grating 211 in region 251 is given by $$\Lambda_{g1} = \frac{1.540}{(3.3594 + 3.16195)} = 0.2361 \; \mu m \quad (8)$$

The grating pitch for grating 212 in region 252 is given by $$\Lambda_{g2} = \frac{1.545}{(3.3594 + 3.16195)} = 0.2369 \; \mu m \quad (9)$$

Each grating is produced with holographically exposed resist and wet chemical etching, or directly written into resist with an electron beam. The loss of the conventionally guided reflector layer mode will be 37 cm$^{-1}$ assuming a bulk loss in this layer of 50 cm$^{-1}$.

To complete the device as a properly biased demultiplexer, the material is initially grown on a p+InP substrate 206. The lower reflector layer 205, the separation layer 204, and the upper reflector layer 203 are grown as p-, and the InP waveguiding layer 202 is grown as n-. The photodetector in each of the region 251 and 252 is defined by diffusing Zn down through the upper reflector layer everywhere except where the photodetector will be placed. This give an isolated pocket of n type InP waveguiding layer, which should be placed roughly above the grating used for coupling. This area of n- material should extend somewhat longer than the length of the grating as shown in FIG. 2, since energy will be coupled into a reverse propagating mode in the reflector layer with an absorption length as mentioned above of 1/37 cm. With a grating of about 50 $\mu$m, about 300 $\mu$m of undisturbed reflector layer 203 should be present in each of the photodetecting regions.

To provide lateral guiding, a ridge can be etched onto the surface of the upper InP waveguiding layer with a depth of about 0.5 $\mu$m. A layer 207 of SiO$_2$ is deposited on the surface with a window opened on top of the ridge through conventional photolithiographic exposure and etching techniques to provide an n contact to the structure through deposited metallic contacts 208 and 209. A p contact is provided through a metallic contact 210 deposited on the bottom of the p+InP substrate 206. A positive voltage is then applied to terminals 208 and 209 with respect to terminal 210, and the reverse biased p-n conjunction establishes a depletion layer into the upper reflector layer 203, thus providing photodetection in the manner described.

I claim:

1. An optical device comprising a first optical waveguiding layer including a first optical material having boundaries to guide light of a selected wavelength in a predetermined direction, means abutting at least one of the boundaries of said first optical waveguiding layer for establishing an antiresonant reflection for a component of light propagating in a direction perpendicular to said predetermined direction, said means for establishing an antiresonant reflection including at least a first reflector layer including a second optical material having an index of refraction greater than that of said first optical material, the optical device characterized in that said first reflector layer also acts as a second optical waveguiding layer by conventional total internal reflection, said optical device includes means effective over a portion of said first and second optical waveguiding layers along said predetermined direction for coupling energy at said selected wavelength from said first optical waveguiding layer into said second optical waveguiding layer, and said second optical waveguiding layer is substantially parallel to said first optical waveguiding layer.

2. An optical device as defined in claim 1 wherein said optical device has a profile of the index of refraction which consists of the magnitude of the index of refraction in said optical device as a function of position in a direction perpendicular to said predetermined direction, and said means for coupling energy comprises a periodic variation in said profile along said predetermined direction thereby forming a grating.

3. An optical device as defined in claim 2 wherein said means for establishing an antiresonant reflection further includes a second reflector layer and an intermediate layer, said second reflector layer being comprised of third optical material separated from said first reflector layer by said intermediate layer wherein said intermediate layer is comprised of fourth optical material having an index of refraction substantially equal to that of said first optical material, said third optical material having an index of refraction greater than that of said first optical material.

4. An optical device as defined in claim 2 wherein said optical device includes means for pumping said first reflector layer in the region occupied by said grating, and means for reflecting light generated in said first reflector layer to form an optical resonator.

5. An optical device as defined in claim 4 wherein said means for establishing an antiresonant reflection further includes a second reflector layer and an intermediate layer, said second reflector layer being comprised of third optical material separated from said first reflector layer by said intermediate layer wherein said intermediate layer is comprised of fourth optical material having an index of refraction substantially equal to that of said first optical material, said third optical material having an index of refraction greater than that of said first optical material.

6. An optical device as defined in claim 4 wherein said means for pumping includes a source of coherent light having a wavelength which is absorbed in the first optical material of said first reflector layer.

7. An optical device as defined in claim 2 wherein said first reflector layer in the vicinity of said grating is photoconductive at said selected wavelength.

8. An optical device as defined in claim 2 wherein the device further includes a p-n junction in the vicinity of said grating.

9. An optical device as defined in claim 7 or 8 wherein the device further includes at least a second grating separated from said first grating along said predetermined direction, said first and second gratings having different pitches such that each is responsive to a different selected wavelength.

* * * * *